United States Patent
Sarma et al.

(10) Patent No.: US 8,394,574 B2
(45) Date of Patent: Mar. 12, 2013

(54) METROLOGY SYSTEMS AND METHODS FOR LITHOGRAPHY PROCESSES

(75) Inventors: Chandrasekhar Sarma, Poughkeepsie, NY (US); Jingyu Lian, Walkill, NY (US); Matthias Lipinski, Poughkeepsie, NY (US); Haoren Zhuang, Walkill, NY (US)

(73) Assignee: Infineon Technologies AG, Munich (DE)

( * ) Notice: Subject to any disclaimer, the term of this patent is extended or adjusted under 35 U.S.C. 154(b) by 88 days.

(21) Appl. No.: 13/246,396

(22) Filed: Sep. 27, 2011

(65) Prior Publication Data

US 2012/0013884 A1    Jan. 19, 2012

Related U.S. Application Data

(62) Division of application No. 12/842,630, filed on Jul. 23, 2010, now Pat. No. 8,067,135, which is a division of application No. 11/504,388, filed on Aug. 15, 2006, now Pat. No. 7,794,903.

(51) Int. Cl.
| | |
|---|---|
| *G03C 5/00* | (2006.01) |
| *G03F 9/00* | (2006.01) |
| *H01L 23/58* | (2006.01) |

(52) U.S. Cl. ......... 430/271.1; 430/51; 430/30; 430/311; 257/48

(58) Field of Classification Search ................ 430/5, 30, 430/271.1, 311; 257/48
See application file for complete search history.

(56) References Cited

U.S. PATENT DOCUMENTS

| | | | |
|---|---|---|---|
| 4,419,013 A | 12/1983 | Heimer | |
| 5,475,766 A | 12/1995 | Tsuchiya et al. | |
| 6,368,516 B1 | 4/2002 | Carpi et al. | |
| 6,379,848 B1 | 4/2002 | McMullen | |
| 6,397,165 B1 | 5/2002 | Fiekowsky | |
| 6,581,193 B1 | 6/2003 | McGhee et al. | |
| 2002/0164065 A1 | 11/2002 | Cai et al. | |
| 2006/0093963 A1 | 5/2006 | Terahara | |
| 2009/0217224 A1 | 8/2009 | Wiaux et al. | |

FOREIGN PATENT DOCUMENTS

| | | |
|---|---|---|
| JP | 59-060439 | 4/1984 |
| JP | 02-116848 | 5/1990 |
| JP | 06-138645 | 5/1994 |
| JP | 08-015854 | 1/1996 |
| JP | 08-248620 | 9/1996 |
| JP | 09-160217 | 6/1997 |
| WO | WO 00/79343 A1 | 12/2000 |
| WO | WO 01/46680 A2 | 6/2001 |
| WO | WO 02/075793 A2 | 9/2002 |

OTHER PUBLICATIONS

Schmidt, M., et al., "Critical Dimension Photomask Metrology Tool Requirements for 0.25 um and Future Microlithography," Proceedings of SPIE: 16th Annual BACUS Symposium on Photomask Technology and Management, Dec. 27, 1996, pp. 208-218, vol. 2884, SPIE, Bellingham, WA.

*Primary Examiner* — Christopher Young

(74) *Attorney, Agent, or Firm* — Slater & Matsil, L.L.P.

(57) ABSTRACT

Metrology systems and methods for lithography processes are disclosed. In one embodiment, a method of manufacturing a semiconductor device includes providing a mask having a plurality of corner rounding test patterns formed thereon. A first semiconductor device is provided, and a layer of photosensitive material of the first semiconductor device is patterned with a plurality of corner rounding test features using the mask and a lithography process. An amount of corner rounding of the lithography process is measured by analyzing the plurality of corner rounding test features relative to other of the plurality of corner rounding test features formed on the layer of photosensitive material of the semiconductor device. The lithography process or the mask is altered in response to the amount of corner rounding measured, and a second semiconductor device is provided. The second semiconductor device is affected using the altered lithography process or the altered mask.

24 Claims, 4 Drawing Sheets

METROLOGY SYSTEMS AND METHODS FOR LITHOGRAPHY PROCESSES

This application is a divisional of patent application Ser. No. 12/842,630, entitled "Metrology Systems and Methods for Lithography Processes," filed on Jul. 23, 2010, which is a divisional of patent application Ser. No. 11/504,388, entitled "Metrology Systems and Methods for Lithography Processes," filed on Aug. 15, 2006, which applications are incorporated herein by reference.

TECHNICAL FIELD

The present invention relates generally to the fabrication of semiconductor devices, and more particularly to metrology systems and methods for lithography processes used in the fabrication of semiconductor devices.

BACKGROUND

Generally, semiconductor devices are used in a variety of electronic applications, such as computers, cellular phones, personal computing devices, and many other applications. Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern made of optically opaque or translucent areas and optically clear or transparent areas on a mask or reticle onto a layer of photosensitive material deposited over a wafer. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a semiconductor wafer or workpiece.

Although assist features such as serifs are often included in patterns to improve the pattern transfer from a lithography mask to a semiconductor device, in many designs, it is desirable for a pattern on a lithography mask to be transferred having exactly the same image as the pattern on the semiconductor device. However, due to diffraction, reflection, and other effects that can occur in a lithography process, rounding of corners of features patterned on a semiconductor device often occurs, which is referred to as "corner rounding." Corner rounding may vary in lithography systems, due to the type of photoresist used, the wavelength of light or energy used in the exposure process, and other parameters of the lithography process, for example.

It is desirable to determine the amount of corner rounding of a particular lithography process, in order to assess the required amount of tolerancing and other factors that impact semiconductor device performance and yields, for example. Current methods of measuring corner rounding involve taking a scanning electron microscope (SEM) image or photograph from a top view of a semiconductor device having functioning features formed therein, and manually measuring the amount of corner rounding of the functional features of the semiconductor device on the photograph. For example, a ruler is used to physically measure the corner rounding on the photograph. However, these methods are performed by human operators and they are subjective measurements, thus the measurements are prone to errors and variations. The manual measurements of the corner rounding in the SEM photographs are also time-consuming.

Thus, what are needed in the art are improved methods of measuring corner rounding of lithography processes used in the fabrication of semiconductor devices.

SUMMARY OF THE INVENTION

These and other problems are generally solved or circumvented, and technical advantages are generally achieved, by preferred embodiments of the present invention, which provide novel methods, systems, and lithography masks for measuring corner rounding.

In accordance with a preferred embodiment of the present invention, a method of manufacturing a semiconductor device includes providing a mask having a plurality of corner rounding test patterns formed thereon, the plurality of corner rounding test patterns comprising at least two angle-containing patterns. A first semiconductor device having a layer of photosensitive material disposed thereon is provided, and the layer of photosensitive material of the first semiconductor device is patterned with a plurality of corner rounding test features using the mask and a lithography process. An amount of corner rounding of the lithography process is measured by analyzing at least one of the plurality of corner rounding test features relative to other of the plurality of corner rounding test features formed on the layer of photosensitive material of the first semiconductor device. The lithography process or the mask is altered in response to the amount of corner rounding measured, and a second semiconductor device is provided. The second semiconductor device is affected using the altered lithography process or the altered mask.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

Figure 1:
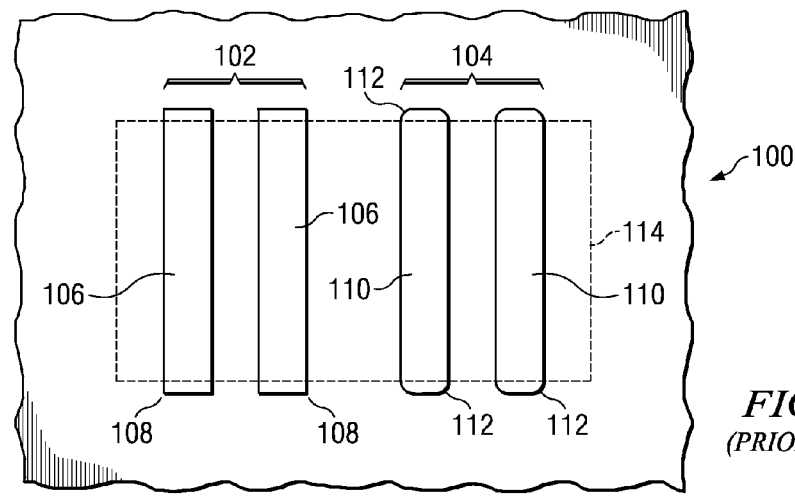
FIG. 1 shows a top view of a prior art semiconductor device that illustrates the problem of corner rounding of features.

FIG. 1 shows a top view of a prior art semiconductor device 100 that exhibits corner rounding of features 110, e.g., at 112. The corner rounding 112 may occur due to diffraction, reflection, and other effects that can occur during a lithography process, for example. A plurality of features 106 and 110 are formed in a first region 102 and a second region 104, respectively, of the semiconductor device 100, as shown. Features 106 in the first region 102 illustrate the desired shape of all features across the surface of the semiconductor device 100. The features 106 may comprise rectangular features such as the gates of transistors or other structures, for example. The rectangular features 106 include corners 108 where a horizontal side of the rectangular features 106 meets a vertical side, e.g., at a substantially 90° angle, as shown.

Features 110 in the second region 104 illustrate corner rounding 112 that can occur in lithography processes. For example, rounding 112 is evident at the corners of the features 110, rather than 90° angles, as shown at the corners 108 of features 106 in the first region 102. Typically, corner rounding 112 tends to occur for all features of a particular size and all locations on a semiconductor device 100 of a particular lithography process, for example, rather than occurring in some locations such as in the second region 104 and not in other locations such as in the first region 102 as shown in FIG. 1.

Corner rounding 112 contributes increasingly to device deterioration as device 100 dimensions are reduced, e.g., as the design node of semiconductor devices 100 shrinks. For example, in 65 nm node technologies, wherein the minimum feature size may be as small as about 55 nm, even moderate corner rounding at a gate contact level or via level can cause devices to be non-functional. As an example, if the features 106 and 110 comprise gates of transistors, the ends of the gates 106 and 110 should extend beyond underlying source and drain regions 114 by a predetermined amount, in order to prevent excessive leakage current. Thus, it is important to determine the amount of corner rounding of a particular lithography process, so that dimensions and tolerancing of dimensions of features may be adjusted and tuned accordingly.

Traditionally, in the past, the amount of corner rounding of lithography processes has been measured manually by measurements of features using critical dimension (CD) SEM prints (e.g., photographs). However, these manual measurements contain the possibility of operator bias, and results thus vary widely for the same structure from operator to operator, for example.

Embodiments of the present invention provide novel methods, test patterns, and test features that may be used to measure corner rounding of lithography processes used to pattern material layers of semiconductor devices. A plurality of corner rounding test features are formed on a device using a plurality of angle-containing test patterns on a lithography mask, and the plurality of corner rounding test features are analyzed relative to other of the plurality of corner rounding test features to determine the amount of corner rounding. Advantageously, the novel measurement techniques and test patterns may be implemented automatically by a SEM tool or other automatic measurement tool. Three preferred embodiments of the present invention will next be described.

Figure 2:
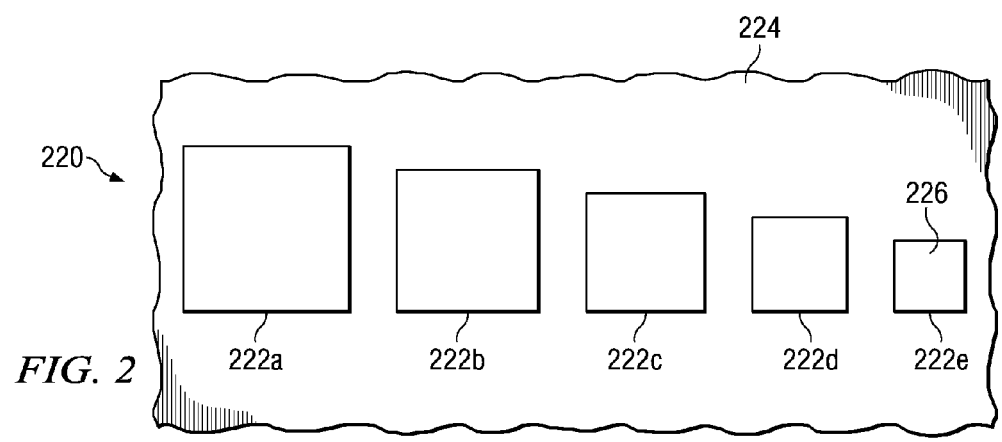
FIG. 2 shows a top view of a lithography mask in accordance with an embodiment of the present invention, wherein a plurality of corner rounding test patterns comprises squares of different sizes.

FIG. 2 shows a top view of a lithography mask 220 in accordance with an embodiment of the present invention, wherein a plurality of corner rounding test patterns 222a, 222b, 222c, 222d, and 222e comprises at least two angle-containing patterns. In this embodiment, the plurality of corner rounding test patterns 222a, 222b, 222c, 222d, and 222e comprises square patterns of different sizes. Angles are located at the corners of each square pattern, and thus the square test patterns 222a, 222b, 222c, 222d, and 222e comprise angle-containing patterns, for example.

The lithography mask 220 includes a substantially opaque or light-absorbing material 226 and a substantially transparent or light-reflecting material 224 attached or bonded to the substantially opaque or light absorbing material 226. Alternatively, material 224 may comprise a substantially opaque or light-absorbing material, and material 226 may comprise a substantially transparent or light-reflecting material, for example, not shown.

The plurality of corner rounding test patterns 222a, 222b, 222c, 222d, and 222e may comprise patterned squares of the substantially opaque or light-absorbing material 226, e.g., in a bright field binary mask, such as the one shown in FIG. 2. The lithography mask 220 may comprise a binary mask, a phase shifting mask, an alternating phase shifting mask, an attenuating phase shifting mask, a bright field mask, a chrome-less mask, a dark field mask, a reflective mask, a transmissive mask, or combinations thereof, as examples. Therefore, the plurality of corner rounding test patterns 222a, 222b, 222c, 222d, and 222e may also comprise apertures or squares formed in the substantially opaque or light-absorbing material 226 and/or in the substantially opaque or light absorbing material 226, for example. The test patterns 222a, 222b, 222c, 222d, and 222e each preferably comprise a square having four sides of equal length.

At least some of the plurality of square test patterns 222a, 222b, 222c, 222d, and 222e preferably comprise a different size than other of the plurality of square test patterns 222a, 222b, 222c, 222d, and 222e. For example, moving horizontally across the mask 220 from the left to the right, each adjacent square test pattern 222a, 222b, 222c, 222d, and 222e may comprise sides having a length that is less than a previous adjacent square test pattern 222a, 222b, 222c, 222d, and 222e, as shown. The square test patterns 222a, 222b, 222c, 222d, and 222e may comprise sides having lengths that are successively smaller by a predetermined amount, e.g., by about 10 to 50 nm, although alternatively the predetermined amount may comprise other dimensions. Alternatively, the square test patterns 222a, 222b, 222c, 222d, and 222e may be positioned relative to one another in other configurations, for example, not shown.

In one embodiment, for example, test pattern 222a comprises sides having a dimension of about 400 nm, and test patterns to the right of test pattern 222a have sides that decrease by about 20 nm from test pattern to test pattern. For example, test pattern 222b may comprise sides having a dimension of about 380 nm, test pattern 222c may comprise sides having a dimension of about 360 nm, test pattern 222d may comprise sides having a dimension of about 340 nm, and test pattern 222e may comprise sides having a dimension of about 320 nm. Additional test patterns 222 may be included in 20 nm increments, down to a test pattern having sides of about 100 nm in dimensions, for example, not shown. Alternatively, the sides of the square test patterns 222a, 222b, 222c, 222d, and 222e and the incremental difference in size of the sides of the square test patterns 222a, 222b, 222c, 222d, and 222e may comprise different dimensions, for example.

Figure 3:
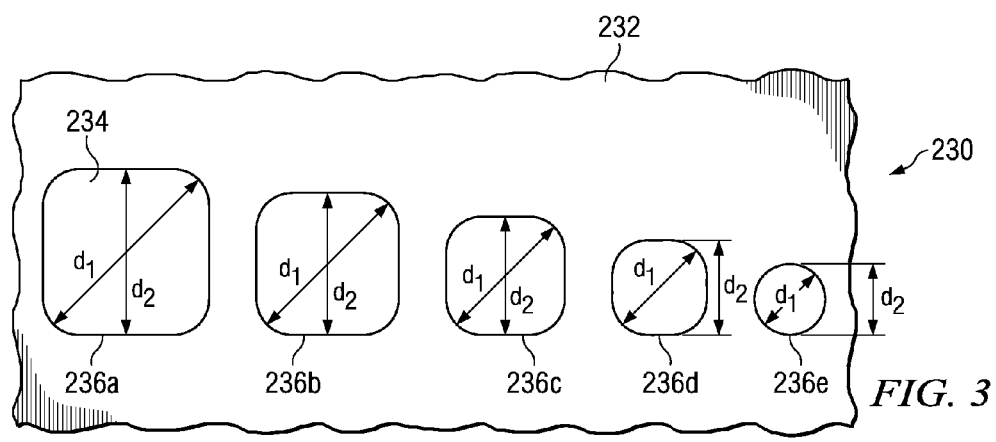
FIG. 3 shows a top view of a semiconductor device having a layer of photosensitive material disposed thereon that has been patterned with a plurality of corner rounding test features using the lithography mask shown in FIG. 2.

Advantageously, as shown in FIG. 3, an amount of corner rounding of a lithography process may be determined by analyzing a plurality of corner rounding test features 236a, 236b, 236c, 236d, and 236e relative to other plurality of corner rounding test features 236a, 236b, 236c, 236d, and 236e formed on a layer of photosensitive material 234 of a semiconductor device 230 using the lithography mask 220 of FIG. 2, for example.

FIG. 3 shows a top view of a semiconductor device 230 having a layer of photosensitive material 234 disposed on a workpiece or substrate 232, wherein the layer of photosensitive material 234 has been patterned using the lithography mask 220 shown in FIG. 2. The layer of photosensitive material 234 of the semiconductor device 230 is patterned using a lithography system (e.g., such as the lithography system 570 shown in FIG. 9, to be described further herein), using the lithography mask 220 as a mask. A plurality of test features 236a, 236b, 236c, 236d, and 236e are formed in the layer of photosensitive material 234, as shown. The plurality of corner rounding test features 236a, 236b, 236c, 236d, and 236e comprises a plurality of substantially square shaped test features 236a, 236b, 236c, and 236d having different sizes and at least one round shaped test feature 236e.

For example, some of the test features 236a, 236b, 236c, and 236d comprise substantially square test features that exhibit corner rounding. In particular, the sharp corners of the test patterns 222a, 222b, 222c, and 222d of the mask 220 are rounded during the test pattern transfer, resulted in rounded corners in the test features 236a, 236b, 236c, and 236d formed on the semiconductor device 230 shown in FIG. 3.

The largest test feature 236e that comprises a circular shape on the semiconductor device 230 indicates the amount of corner rounding of the lithography process. The amount of corner rounding is equal to one-half of the length of a side of test pattern 222e of the lithography mask 220 that was used to form the test feature 236e on the semiconductor device 230. Smaller test features (e.g., continuing to the right of test feature 236e) may also be formed that comprise a circular shape (not shown); however, the largest test feature 236e comprising a circular shape is the test feature 236e that may be used to determine the amount of corner rounding.

The amount of corner rounding may be determined manually by an operator of a lithography system, by visually observing the shape of the test features 236a, 236b, 236c, 236d, and 236e formed in the layer of photoresist 234, for example. The position of the largest circular shaped test feature 236e may be observed and correlated with the test pattern 222e on the lithography mask 220, to determine the length of a side of the square test pattern 222e, which is then divided by 2 to determine the amount of corner rounding. Because no actual measuring is made of the test features, but rather, the shapes of the test features are visually observed, the tests are low in subjectivity and result in more accurate results.

Measuring the amount of corner rounding may also be performed by an automatic measurement tool in a preferred embodiment. The automatic measurement tool may comprise a SEM, scatterometer, or other automated measurement device adapted to perform measurements of dimensions of test features 236a, 236b, 236c, 236d, and 236e of semiconductor devices 230.

Referring again to FIG. 2, in some embodiments, each side of the test patterns 222a, 222b, 222c, 222d, and 222e preferably have a finite thickness, e.g., about 100 to 200 nm or less, of the opaque or light absorbing material 226 surrounded by the transparent or light reflecting material 224 on the inside and outside of the square test patterns 222a, 222b, 222c, 222d, and 222e (not shown in the FIG. 2). Thus, the test features 236a, 236b, 236c, 236d, and 236e of semiconductor devices 230 also comprise square patterns with sides having a finite thickness. In this embodiment, preferably measurements of the inner radius and/or line-to-line spacing (e.g., from opposing sides of the squares) of the finite thickness-sided square test patterns 236a, 236b, 236c, 236d, and 236e are taken to determine corner rounding, for example.

Figure 4:
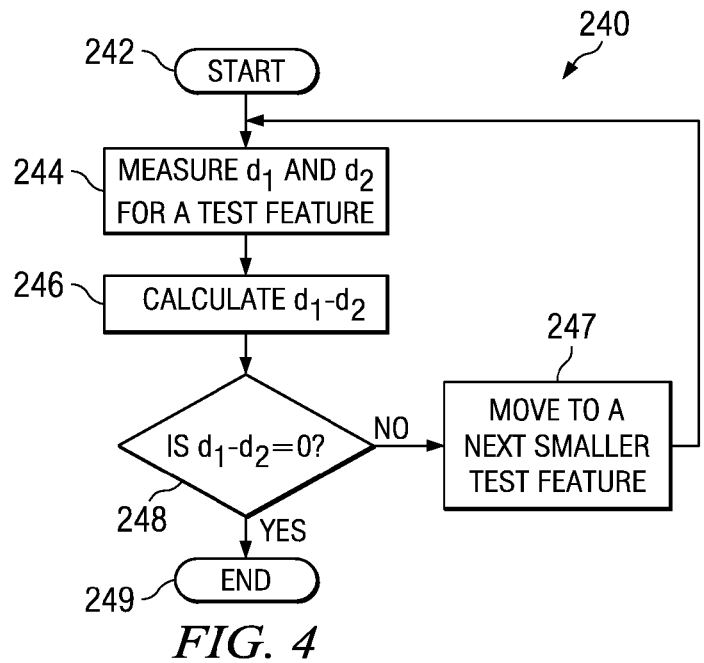
FIG. 4 is a flow chart showing a method of determining the amount of corner rounding of a lithography process in accordance with the embodiment of the present invention shown in FIGS. 2 and 3.

FIG. 4 is a flow chart 240 showing an exemplary method of determining the amount of corner rounding of a lithography process using an automated measurement tool (e.g., such as automated measurement tool 578 shown in FIG. 9, to be described further herein) in accordance with the embodiment of the present invention shown in FIGS. 2 and 3. First, the automatic measuring process is started, e.g., at step 242. A test feature 236a (e.g., the largest test feature 236a, although the process may be started with any test feature 236a, 236b, 236c, 236d, or 236e) is measured diagonally at $d_1$ and from side-to-side at $d_2$ (step 244). The two measurements $d_1$ and $d_2$ are compared, e.g., a calculation of $(d_1-d_2)$ is made at step 246. If $(d_1-d_2)$ is equal to zero (step 248), then the largest circular test pattern 236x has been found, and the automatic measuring process is ended (step 249). However, if $(d_1-d_2)$ is greater than zero, then the automatic measurement tool moves to the next smaller sized test feature 236b, 236c, 236d, or 236e (step 247), and steps 244, 246, and 248 are repeated until the largest test feature 236a, 236b, 236c, 236d, or 236e is found where $(d_1=d_2)$, or wherein $(d_1-d_2=0)$. The amount of corner rounding is $\frac{1}{2}(d_1$ or $d_2)$ in this embodiment, for example.

Because there may be a certain amount of measurement error or noise associated with CD-SEM measurements, the result of the calculation $(d_1-d_2)$ may not be exactly zero. To circumvent this, a predetermined number, e.g., a finite number, may be established that corresponds to measurement uncertainty. The predetermined finite number may comprise about 2 nm, as an example, although other finite numbers may also be used. The predetermined finite number may comprise a number below which ($d_1-d_2$) will be considered as equal and hence also corresponds to the determination of amount of corner rounding being achieved. For example, if ($d_1-d_2$)=(0 to 2 nm), or (−2 nm to 2 nm), then it is determined that the largest circular test pattern 236x has been found, and the automatic measuring process is ended (step 249).

Thus, in the embodiment of the present invention shown in FIGS. 2 and 3, measuring the amount of corner rounding comprises measuring a first distance $d_1$ from a first corner to a second corner opposite the first corner of a first test feature 236a, measuring a second distance $d_2$ from a first side to a second side opposite the first side of the first test feature 236a, and comparing the second distance $d_2$ and the first distance $d_1$ to determine the amount of corner rounding of the lithography process. If $d_1$ is greater than $d_2$ of a first larger test features 236a, then measurement of at least one second test feature 236b, 236c, 236d, and 236e is then continued, e.g., a third distance (e.g., $d_1$) from a first corner to a second corner opposite the first corner of at least one second test feature 236b is measured, a fourth distance, (e.g., $d_2$) from a first side to a second side opposite the first side of the at least one second test feature 236b, and the fourth distance $d_2$ and the third distance $d_1$ are compared. The measurement of successively smaller additional second test features 236c, 236d, and 236e is continued until one of the first test feature 236a or at least one second test feature 236b, 236c, 236d, or 236e is found wherein the first distance $d_1$ (e.g., of test feature 236a) is substantially equal to the second distance $d_2$ (of test feature 236a), or wherein the third distance $d_1$ (e.g., of a second test feature 236b, 236c, 236d, or 236e) is substantially equal to the fourth distance $d_2$ (e.g., of a second test feature 236b, 236c, 236d, or 236e). The amount of corner rounding of the lithography process is equal to half of the first distance or second distance, or half of the third distance or fourth distance. When distance $d_2$=distance $d_1$ as test features 236a, 236b, 236c, 236d, or 236e are measured in decreasing size, then the largest test feature 236a, 236b, 236c, 236d, or 236e has been found that comprises a circular shape, for example.

Advantageously, if the test features 236a, 236b, 236c, 236d, or 236e are measured according to their size, from larger to smaller, the time taken the determine the amount of corner rounding may be minimized. The process may be stopped when the test feature 236a, 236b, 236c, 236d, or 236e is found where ($d_1=d_2$), or wherein $d_2$ varies an insignificant amount from $d_1$, e.g., less than about 2 nm or so, as an example. In this embodiment, it is advantageous for the test features 236a, 236b, 236c, 236d, or 236e to be positioned on the semiconductor device 230 in an arrangement that is easily accessible by the automated measurement device, e.g., in rows or columns. Alternatively, all of the test features 236a, 236b, 236c, 236d, or 236e may be measured, for example, and the placement of the test features 236a, 236b, 236c, 236d, or 236e may be random, wherein the automated measurement device is adapted to determine using software the location and size of the test patterns of the mask and test features of the semiconductor device.

Thus, corner rounding may be measuring using an inner corner rounding measurement in accordance with an embodiment of the present invention, as shown in FIGS. 2 through 4. Corner rounding may also be measuring using an outer corner rounding measurement in accordance with embodiments of the present invention, as shown in FIGS. 5 and 6.

Figure 5:
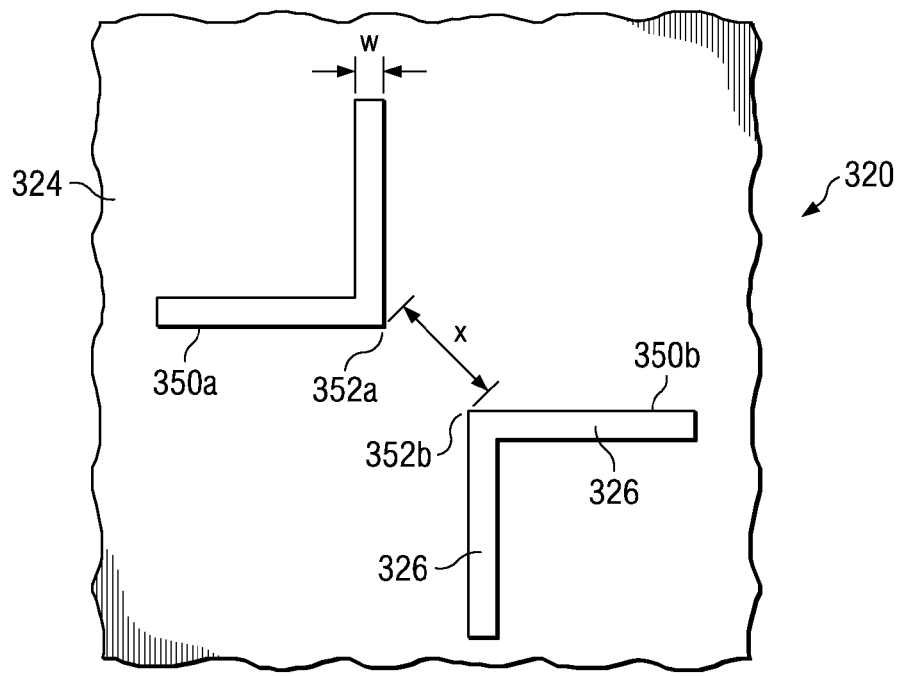
FIG. 5 shows a top view of a lithography mask in accordance with an embodiment of the present invention, wherein a plurality of corner rounding test patterns comprises at least two angled test patterns disposed adjacent one another at an outer side of their angles.
Figure 6:
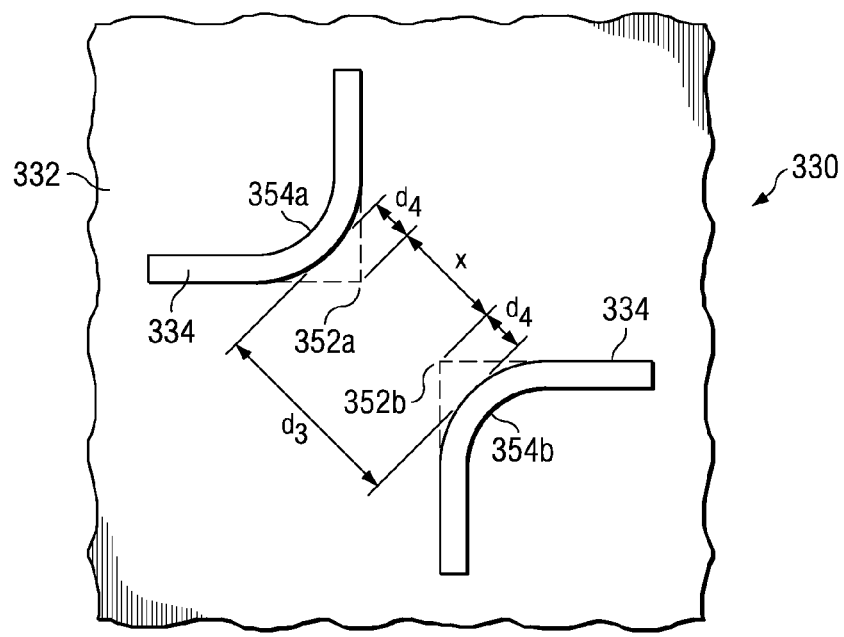
FIG. 6 shows a top view of a semiconductor device having a layer of photosensitive material disposed thereon that has been patterned using the lithography mask shown in FIG. 5.

FIG. 5 shows a top view of a lithography mask 320 in accordance with another embodiment of the present invention. FIG. 6 shows a semiconductor device 330 patterned using the lithography mask of FIG. 5. Like numerals are used for the various elements that were used to describe the previous figures. To avoid repetition, each reference number shown in FIG. 5 is not described again in detail herein. Rather, similar materials x20, x24, x26, etc. . . . are preferably used for the various material layers shown as were described for the previous figures, where x=2 in FIGS. 2 through 4, and x=3 in FIGS. 5 and 6.

In this embodiment, the plurality of corner rounding test patterns 350a and 350b comprises at least two angled or angle-containing test patterns disposed adjacent one another at an outer side of their angles. The plurality of corner rounding test patterns 350a and 350b comprises at least one first test pattern 350a having a first angle and at least one second test pattern 350b having a second angle, an outer corner 352a of the first angle of a first test pattern 350a being proximate yet spaced apart from an outer corner 352b of the second angle of a second test pattern 350b by a predetermined distance x on the lithography mask 320.

The corner rounding test patterns 350a and 350b in this embodiment are shown as comprising L shapes; alternatively, the corner rounding test patterns 350a and 350b may also comprise the shape of a square, a rectangle, or letters of the alphabet, or combinations thereof, as examples. The angles of the test patterns 350a and 350b are shown as 90 degrees; alternatively, other angles, e.g., greater than 0 and less than 180 degrees, may also be used. Preferably, an angle of 90 degrees or less is used, in some embodiments, for the angles of the test patterns 350a and 350b. The test patterns 350a and 350b may be rotated together such that the line marked "x" between the test patterns is horizontal, vertical, or at any angle, as examples.

The predetermined distance x between the outer corners 352a and 352b of the test patterns 350a and 350b, respectively, may comprise a critical dimension (CD) of a semiconductor device, for example. The predetermined distance x may comprise a minimum feature size of a semiconductor device, as another example. The predetermined distance x may also comprise other dimensions.

FIG. 6 shows a top view of a semiconductor device 330 comprising a workpiece 332 having a layer of photosensitive material 334 disposed thereon that has been patterned using the lithography mask 320 shown in FIG. 5. The test features 354a and 354b comprise substantially L shapes that exhibit corner rounding of the outer corners 352a and 352b of the test patterns 350a and 350b of the lithography mask 320 shown in FIG. 5. Alternatively, the corner rounding test features 354a and 354b may comprise other shapes, such as an L, T, Z, U, W, V shape, or other letters of the alphabet, a square, or combinations thereof, for example, depending on the shape of the test patterns 350a and 350b of the mask 320, for example.

Corner rounding is determined by analyzing the test features 354a and 354b relative to one another. For example, in this embodiment, measuring the amount of corner rounding of the lithography process comprises measuring a distance $d_3$ between the outer corner of the first angle of the first test pattern 350a and the outer corner of the second angle of the second test pattern 350b. The corner rounding is calculated by solving Equation 1 below.

$$d_4=(d_3-x)/2; \qquad \text{Eq. 1}$$

wherein $d_4$ is the amount of corner rounding calculated.

Thus, in the embodiment shown in FIGS. 5 and 6, corner rounding is determined using an outer corner rounding measurement, by measuring the distance between outer corners of angled features 354a and 354b. The radius of curvature between the outer corners is measured, which can be automated in a SEM tool, for example.

Figure 7:
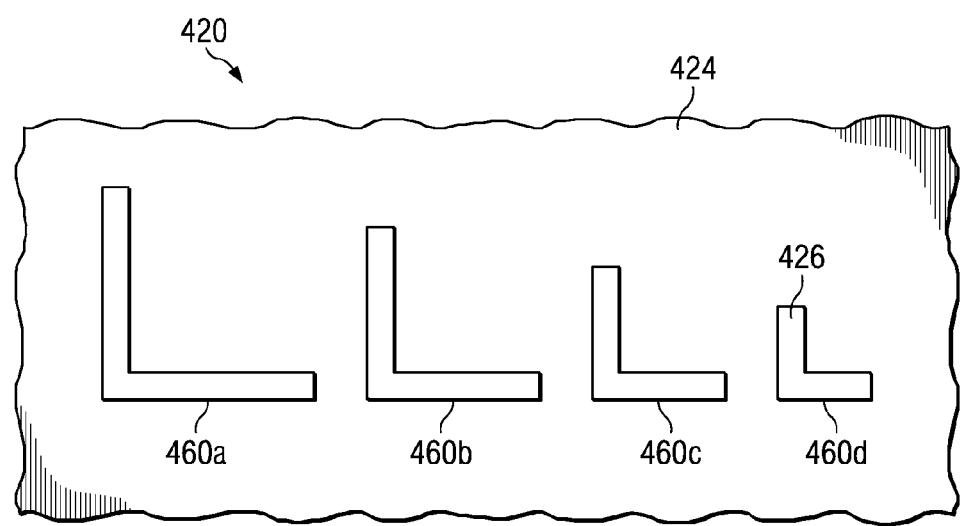
FIG. 7 shows a top view of a lithography mask in accordance with an embodiment of the present invention, wherein a plurality of corner rounding test patterns comprises L shapes of different sizes.
Figure 8:
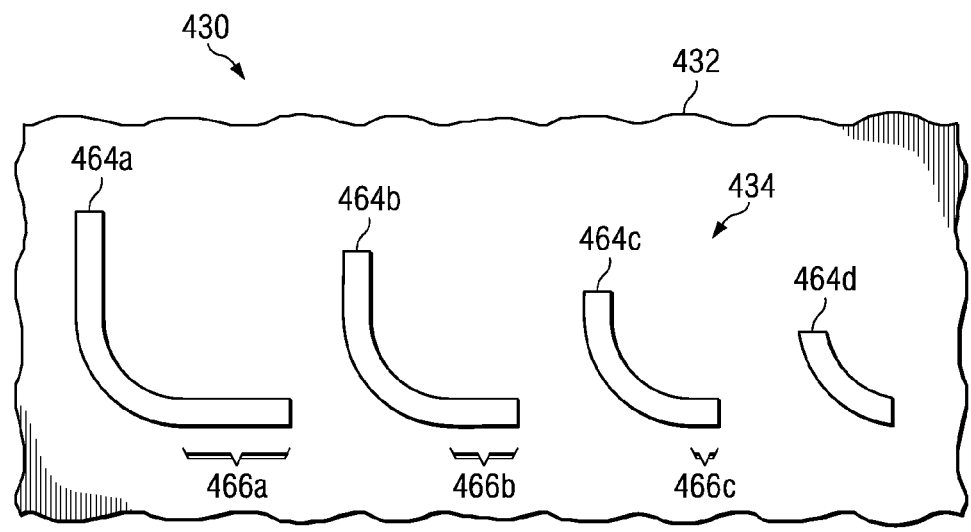
FIG. 8 shows a top view of a semiconductor device having a layer of photosensitive material disposed thereon that has been patterned using the lithography mask shown in FIG. 7.

FIG. 7 shows a top view of a lithography mask in accordance with an embodiment of the present invention, wherein a plurality of corner rounding test patterns comprises L shapes of different sizes. FIG. 8 shows a top view of a semiconductor device having a layer of photosensitive material disposed thereon that has been patterned using the lithography mask shown in FIG. 7. This embodiment is similar to the embodiment shown in FIGS. 2 through 4, in that successively smaller test patterns 460a, 460b, 460c, and 460d are used to determine the amount of corner rounding. However, in this embodiment, the test patterns 460a, 460b, 460c, and 460d are differently shaped, e.g., they comprise L shapes or other angled shapes. The test patterns are analyzed relative to one another to determine the amount of corner rounding of the lithography process.

For example, the lithography mask 430 comprises a plurality of angled or angle-containing test patterns 460a, 460b, 460c, and 460d formed thereon, at least some of the plurality of angled test patterns 460a, 460b, 460c, and 460d comprising a different size than other of the plurality of angled test patterns 460a, 460b, 460c, and 460d. Patterning the layer of photosensitive material 434 of the semiconductor device 430 comprises forming a plurality of corner rounded test features 464a, 464b, 464c, and 464d. Measuring the amount of corner rounding comprises analyzing the shape of the plurality of angled test features 464a, 464b, 464c, and 464d formed, to determine whether a portion of each of the plurality of angled test features 464a, 464b, 464c, and 464d comprises a straight line.

The method includes determining which of the plurality of corner rounding features 464a, 464b, 464c, and 464d comprises a largest angled test pattern for which a corner rounded test feature does not comprise a straight line portion 466a, 466b, and 466c, such as test feature 464d in FIG. 8. The amount of corner rounding comprises a length of a side of the largest angled test pattern, e.g., test pattern 460d of FIG. 7, for which the corner rounded test feature 464d does not comprise a straight line portion.

The test features 464a, 464b, 464c, and 464d may be observed visually by an operator to determine which test feature 464d is completely curved and has no straight line portion. Alternatively, an automated measurement device may be used to determine the amount of corner rounding, by detecting successively smaller test feature 464a, 464b, 464c, and 464d, stopping the measurements when a test feature 464d having no straight portion is detected, for example.

Note that in the embodiments shown in FIGS. 5, 6, 7, and 8, the width w of the L-shaped or angled test features 354a, 354b, 464a, 464b, 464c, and/or 464d may comprise a minimum feature size of a lithography system, for example, such as about 100 nm or less, or other dimensions. In other embodiments, the width of the L-shaped or angled test features 354a, 354b, 464a, 464b, 464c, and/or 464d may comprise other dimensions.

Figure 9:
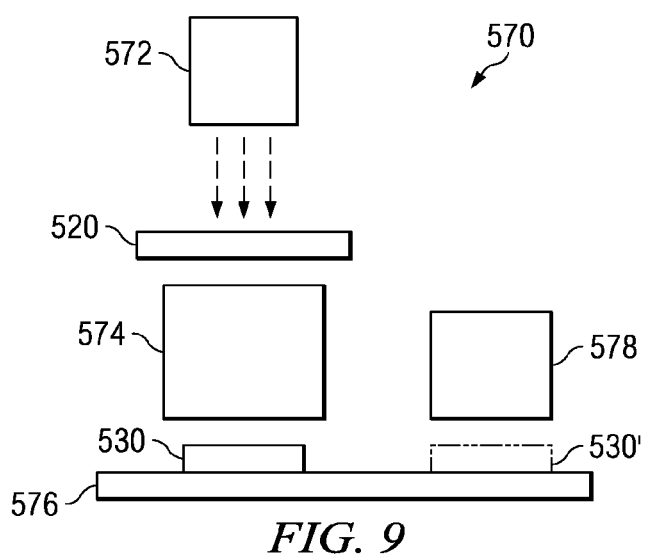
FIG. 9 illustrates a lithography system adapted to implement the novel methods of measuring corner rounding in accordance with embodiments of the present invention described herein.

FIG. 9 illustrates a lithography system 570 adapted to implement the novel methods of measuring corner rounding in accordance with embodiments of the present invention described herein. The lithography system 570 includes a support 576 for a device 530 (e.g., such as semiconductor devices 230, 330, and 430 described previously herein) having a layer of photosensitive material disposed thereon. The lithography system 570 includes a projection lens system 574 proximate the support 576 for the device 530. The projection lens system 574 comprises a plurality of lenses adapted to direct light or energy towards the device 530. The lithography system 570 includes an illuminator 572 adapted to produce the light or energy, proximate the projection lens system 574.

A lithography mask 520 (e.g., such as masks 220, 320, and 420 described previously herein) is disposed between the projection lens system 574 and the illuminator 572. The lithography mask 520 includes a plurality of corner rounding test patterns; e.g., square test patterns 222a, 222b, 222c, 222d, and 222e shown in FIG. 2, angled test patterns 350a and 350b shown in FIG. 5, and/or angled test patterns 460a, 460b, 460c, and 460d shown in FIG. 7.

The lithography mask 520 may comprise a mask designed only for test purposes, e.g., to measure corner rounding and/or other parameters of the lithography system 570 or lithography process. Alternatively, the lithography mask 520 may comprise a mask used for patterning a semiconductor device, e.g., active areas are formed on the semiconductor device using the lithography mask 520, and the test features 236a, 236b, 236c, 236d, 236e, 354a, 354b, 464a, 464b, 464c, and/or 464d may be positioned in dedicated test regions of a die. Alternatively, the corner rounding test features 236a, 236b, 236c, 236d, 236e, 354a, 354b, 464a, 464b, 464c, and/or 464d may be positioned in an unused region of a die or on the kerf of a semiconductor wafer, to save space. In other embodiments, the corner rounding test features 236a, 236b, 236c, 236d, 236e, 354a, 354b, 464a, 464b, 464c, and/or 464d may be placed in a scribe region of a die, and after corner rounding measurements are made, the corner rounding test features 236a, 236b, 236c, 236d, 236e, 354a, 354b, 464a, 464b, 464c, and/or 464d are destroyed and/or scrapped, e.g., after singulation of the die into individual die, for example.

Again, the amount of corner rounding of a lithography process performed using the lithography system may be determined by analyzing a plurality of corner rounding test features 236a, 236b, 236c, 236d, 236e, 354a, 354b, 464a, 464b, 464c, and/or 464d formed on the layer of photosensitive material 234, 334, 434, or other material layer of the devices 230, 330, and 430, relative to other of the plurality of corner rounding test features 236a, 236b, 236c, 236d, 236e, 354a, 354b, 464a, 464b, 464c, and/or 464d. The amount of corner rounding of the lithography process is determinable by an operator of the lithography system or by an automatic measurement device 578. For example, the lithography system 570 may include an automatic measurement device 578, wherein the amount of corner rounding of the lithography process is determinable by the automatic measurement device 578. The automatic measurement device 578 may comprise a SEM, a scatterometer, or other automatic measurement tool, as examples. The support 576 may be adapted to move the semiconductor device 530 closer to the automatic measurement device 578 for measurements of the corner rounding, as shown at 530', for example.

The lithography system 570 may comprise an optical lithography system, a non-optical lithography system, an x-ray lithography system, an interference lithography system, a short wavelength lithography system, a Scattering with Angular Limitation in Projection Electron-beam Lithography (SCALPEL) system, an immersion lithography system, a lithography system that utilizes visible, ultraviolet (UV) or extreme UV (EUV) light, or combinations thereof. Embodiments of the present invention may be implemented in lithography systems, steppers, scanners, step-and-scan exposure tools, or other exposure tools, as examples. The embodiments described herein are implementable in lithography systems 570 that use both refractive and reflective optics, for example.

Embodiments of the present invention also include algorithms for measuring and calculating corner rounding of lithography processes, for example. An algorithm for calculating corner rounding may be adapted to calculate the corner rounding automatically on the basis of measurement data, for example. The algorithm may be implemented in software and/or hardware of the automatic measurement device 578 of the lithography system 570, for example. The algorithm may be designed so that the automatic measurement device 578 is adapted to instruct the lithography system 570 to stop further measurements, for example, without requiring operator intervention.

For example, in accordance with a preferred embodiment of the present invention, an algorithm comprises obtaining corner rounding measurement data, wherein obtaining the corner rounding measurement data comprises taking measurements of a first corner rounding test feature relative to at least one second corner rounding test feature of a material layer of a semiconductor device that has been patterned using a mask having a plurality of corner rounding test patterns formed thereon and a lithography process. The algorithm includes calculating an amount of corner rounding of the lithography process by analyzing the corner rounding measurement data. The calculating step may be automatic, for example. The corner rounding measurement data may include indicia of a determination of the amount of corner rounding, and the algorithm may include discontinuing taking measurements of the first corner rounding test feature relative to the at least one second corner rounding test feature, upon indication that the determination of the amount of corner rounding has been achieved, as an example.

The corner rounding measurements and tests of embodiments of the present invention may be implemented at an initial set-up of a process for a particular semiconductor device design. A single wafer or a few wafers may be processed using the lithography system 570 shown in FIG. 9, and lithography process parameters may be changed or altered until an acceptable amount of corner rounding is determined for features of the die. For example, the type of photoresist may be changed, the wavelength of energy used, dose of the exposure, and other parameters may be changed to achieve the desired amount of corner rounding. The tolerancing (e.g., a tolerance amount) of the semiconductor device design may also be changed, e.g., a mask pattern may be changed, due to the amount of corner rounding measured. The layout of a lithography mask may be changed, or an amount of optical proximity correction (OPC) of a lithography mask may be altered, in response to the amount of corner rounding measured, for example. The novel corner rounding test and measurement methods may also be implemented periodically, and lithography process parameters may be re-adjusted as needed, for example.

Embodiments of the present invention include methods of manufacturing semiconductor devices 230, 330, and 430. The corner rounding measurements may be made on a first semiconductor device 230, 330, and 430, and a parameter of the lithography process or a design parameter of the mask may be changed or altered, based on the amount of corner rounding determined. A second semiconductor device 230, 330, and 430 may then be affected using the altered lithography process or the altered mask.

In some embodiments, for example, a semiconductor wafer with a photosensitive material layer disposed thereon may be provided, and the photosensitive material layer is irradiated through a lithography mask, e.g., such as masks 220, 320, 420, and 520 described herein. A portion of the photosensitive material layer is removed to expose a portion of the wafer, the removed portion based on a pattern of the lithography mask. The exposed portion of the wafer is then changed. The exposed portion may be etched away, altered by exposure to a chemical or implantation process, or a material layer may be formed over the exposed portion, as examples, although other changes may also be implemented to the exposed portion of the wafer.

In one embodiment, a method of manufacturing a semiconductor device includes providing a mask 220, 320, 420, and 520 having a plurality of corner rounding test patterns formed thereon. A first semiconductor device is provided, and a layer of photosensitive material of the first semiconductor device is patterned with a plurality of corner rounding test features using the mask and a lithography process. An amount of corner rounding of the lithography process is measured by analyzing the plurality of corner rounding test features relative to other of the plurality of corner rounding test features formed on the layer of photosensitive material of the semiconductor device. The lithography process or the mask is altered in response to the amount of corner rounding measured, and a second semiconductor device is provided. The second semiconductor device is affected using the altered lithography process or the altered mask. The second semiconductor device may have a layer of photosensitive material formed thereon, and the layer of photosensitive material may be patterned using the altered lithography process or the altered mask, for example. The layer of photosensitive material may then be used to pattern a material layer of a semiconductor device, or change or add a material to the exposed material layer through the patterned layer of photosensitive material, for example.

Embodiments of the present invention also include semiconductor devices 230, 330, and 430 patterned using the methods and lithography system 570 described herein, for example. For example, in one embodiment, a semiconductor device 230, 330, and 430 includes a workpiece 232, 332, and 432, and a plurality of corner rounding test features 236a, 236b, 236c, 236d, 236e, 354a, 354b, 464a, 464b, 464c, and/or 464d disposed in a material layer 234, 334, and 434 disposed on the workpiece 232, 332, and 432. The material layer may comprise a layer of photosensitive material 234, 334, and 434, as shown in FIGS. 3, 6, and 8.

Alternatively, in other embodiments, the layer of photosensitive material 234, 334, and 434 may be used as a mask to pattern a material layer (not shown) disposed on the workpiece 232, 332, and 432, for example. The material layer may comprise a conductive material, an insulating material, or a semiconductive material, as examples. After the corner rounding test features 236a, 236b, 236c, 236d, 236e, 354a, 354b, 464a, 464b, 464c, and/or 464d are transferred to the material layer, the material layer may then be measured and used to determine the amount of corner rounding of the lithography process.

The semiconductor device 230, 330, and 430 may comprise a plurality of die, wherein the plurality of corner rounding test features 236a, 236b, 236c, 236d, 236e, 354a, 354b, 464a, 464b, 464c, and/or 464d are formed in a dedicated region of a die, an unused region of a die, a kerf region of a semiconductor wafer, a test region of a die, a scribe region of a die, or combinations thereof, as examples. The plurality of corner rounding test features 236a, 236b, 236c, 236d, 236e, 354a, 354b, 464a, 464b, 464c, and/or 464d may comprise an L, T, Z, U, W, or V shape, a square, other shapes, or combinations thereof, as examples.

The plurality of corner rounding test features may comprise a plurality of substantially square shaped test features 236a, 236b, 236c, 236d having different sizes and at least one round shaped test feature 236e, as shown in FIG. 3. Or, the plurality of corner rounding test features may comprise a plurality of substantially L shaped test features 460a, 460b, 460c having different sizes and at least one entirely curved test feature 460d, as shown in FIG. 8. Alternatively, the plurality of corner rounding test features may comprise at least two angled test features 350a and 350b disposed adjacent one another at an outer side or outer corner of their angles, as shown in FIG. 6. The plurality of corner rounding test features may comprise combinations of all three embodiments on a single die or semiconductor device 230, 330, 430, or 530 for example. The results of one or more embodiments of corner rounding measurements may be compared or averaged to determine the corner rounding of a lithography system, for example.

The masks 220, 320, 420, and 520 described herein may comprise a substantially transparent material such as quartz glass having a thickness of about ¼", with an opaque material such as chromium, having a thickness of about 30 nm bonded to the quartz glass. Alternatively, one of the material layers may comprise about 70 nm of a translucent material such as molybdenum silicon (MoSi), or a bilayer of tantalum and silicon dioxide (Ta/SiO$_2$). The masks 220, 320, 420, and 520 may also be comprised of multiple layers of silicon and molybdenum to form a reflecting surface and with an absorber material of tantalum nitride (TaN), for example. Alternatively, other materials and dimensions may also be used for the material layers of the masks 220, 320, 420, and 520 described herein, for example.

Advantages of embodiments of the invention include providing novel methods of determining and measuring corner rounding. Three embodiments are described that enable the measurement of corner rounding of a lithography process automatically using a CD-SEM tool, without requiring any operator intervention. For example, the novel measurements and analyses of the corner rounding test features described herein may be implemented in the software or code of a SEM tool, and programmed to perform the measurements and calculations described herein. Advantageously, subjectivity and operator error may thus be removed from corner rounding measurements and tests, providing accurate test results.

By forming corner rounding test features 236a, 236b, 236c, 236d, 236e, 464a, 464b, 464c, and/or 464d of the embodiments shown in FIGS. 2, 3, 7, and 8 having successively smaller sizes, advantageously, the onset amount of corner rounding of a lithography process can be determined, in embodiments of the present invention, thus reducing the amount of time for the measurements of corner rounding.

Alternatively, measurements of all of the test features 236a, 236b, 236c, 236d, 236e, 354a, 354b, 464a, 464b, 464c, and/or 464d formed on a device 230, 330, and 430 may be made, and all of the data may be evaluated, for example.

In the embodiment shown in FIGS. 5 and 6, advantageously, only two test patterns 350a and 350b may be required to determine the corner rounding, and only one measurement step is required. Alternatively, the distance between the angled test patterns 350a and 350b on the mask 320 may be varied, and a plurality of pairs of test patterns 350a and 350b may be used on a mask 320 to measure the effect of proximity on the corner rounding test features 354a and 354b formed on the semiconductor device 330, for example.

The novel corner rounding test patterns may be formed in lithography masks dedicated to testing the lithography process of a lithography system, for example. Alternatively, the test patterns may be implemented in lithography masks used to manufacture production semiconductor devices, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a workpiece; and
a plurality of corner rounding test features disposed in a material layer disposed over the workpiece, wherein the plurality of corner rounding test features comprises a plurality of substantially square shaped test features having different sizes and at least one round shaped test feature, and wherein each of the plurality of corner rounding test features is disposed adjacent each other.

2. The semiconductor device according to claim 1, wherein the material layer comprises a layer of a conductive material or a semiconductive material.

3. The semiconductor device according to claim 1, wherein the semiconductor device comprises a plurality of die, wherein the plurality of corner rounding test features are formed in a dedicated region of a die, an unused region of a die, a test region of a die, a scribe region of a die, a kerf region of the workpiece, or combinations thereof.

4. The semiconductor device according to claim 1, wherein the plurality of corner rounding test features comprises an L, T, Z, U, W, or V shape, a square, or combinations thereof.

5. The semiconductor device according to claim 1, wherein the semiconductor device comprises a plurality of die, wherein the plurality of corner rounding test features are formed in a test region of a die.

6. The semiconductor device according to claim 1, wherein the semiconductor device comprises a plurality of die, wherein the plurality of corner rounding test features are formed in a kerf region of the workpiece.

7. The semiconductor device according to claim 1, wherein the material layer comprises a layer of an insulating material.

8. The semiconductor device according to claim 1, wherein the material layer comprises a layer of a photosensitive material.

9. The semiconductor device according to claim 1, wherein an amount of corner rounding may be determined by analyzing the plurality of corner rounding test features relative to other of the plurality of corner rounding test features.

10. The semiconductor device according to claim 1, wherein at least one of the plurality of corner rounding test features is configured to be analyzed relative to other of the plurality of corner rounding test features.

11. The semiconductor device according to claim 1, wherein the plurality of corner rounding test features further comprises a plurality of angled shaped test features having different sizes and at least one entirely curved test feature, at least two angled test features disposed adjacent one another at an outer side of their angles, or combinations thereof.

12. A semiconductor structure for measuring corner rounding, comprising:
a workpiece; and
a plurality of corner rounding test features disposed in a photosensitive material layer disposed over the workpiece, wherein the plurality of corner rounding test features comprises a plurality of angled shaped test features having different sizes and at least one entirely curved test feature, wherein each of the plurality of corner rounding test features is disposed adjacent each other, wherein a shape of the plurality of angled shaped test features is a measure of the corner rounding.

13. The semiconductor structure according to claim 12, wherein an amount of the corner rounding may be determined by analyzing the shape of the plurality of angled shaped test features and determining whether a portion of each of the plurality of angled shaped test features comprises a straight line.

14. The semiconductor structure according to claim 12, wherein an amount of the corner rounding comprises a length of a side of the largest one of the plurality of angled shaped test features for which the corner rounded test feature does not comprise a straight line portion.

15. The semiconductor structure according to claim 12, wherein a width of each of the plurality of angled shaped test features comprises a minimum feature size.

16. The semiconductor structure according to claim 12, wherein the plurality of corner rounding test features further comprises a plurality of substantially square shaped test features having different sizes and at least one round shaped test feature, at least two angled test features disposed adjacent one another at an outer side of their angles, or combinations thereof.

17. The semiconductor device according to claim 12, wherein the semiconductor device comprises a plurality of die, wherein the plurality of corner rounding test features are formed in a test region of a die.

18. The semiconductor device according to claim 12, wherein the semiconductor device comprises a plurality of die, wherein the plurality of corner rounding test features are formed in a kerf region of the workpiece.

19. A semiconductor structure for measuring corner rounding, comprising:
a workpiece; and
a plurality of corner rounding test features disposed in a photosensitive material layer disposed over the workpiece, wherein the plurality of corner rounding test features comprises at least two angled test features disposed adjacent one another at an outer side of their angles, wherein each of the plurality of corner rounding test features is disposed adjacent each other, wherein a first distance between the at least two angled test features is a measure of the corner rounding.

20. The semiconductor structure according to claim 19, wherein the plurality of corner rounding test features further comprises a plurality of substantially square shaped test features having different sizes and at least one round shaped test feature, a plurality of angled shaped test features having different sizes and at least one entirely curved test feature, or combinations thereof.

21. The semiconductor structure according to claim 19, wherein a width of each of the at least two angled test features comprises a minimum feature size.

22. The semiconductor structure according to claim 19, wherein the first distance is a distance between the outer corner of the first angle of the first feature of the at least two angled test features and the outer corner of the second angle of the second feature of at least two angled test features.

23. The semiconductor device according to claim 19, wherein the semiconductor device comprises a plurality of die, wherein the plurality of corner rounding test features are formed in a test region of a die.

24. The semiconductor device according to claim 19, wherein the semiconductor device comprises a plurality of die, wherein the plurality of corner rounding test features are formed in a kerf region of the workpiece.

* * * * *